United States Patent

[11] 3,629,672

[72] Inventor Peter Wilhelmus Maria Van de Water
Nijmegen, Netherlands

[21] Appl. No. 14,041
[22] Filed Feb. 25, 1970
[45] Patented Dec. 21, 1971
[73] Assignee U.S. Philips Corporation
New York, N.Y.
[32] Priority Mar. 1, 1969
[33] Netherlands
[31] 6903229

[54] SEMICONDUCTOR DEVICE HAVING AN IMPROVED HEAT SINK ARRANGEMENT
6 Claims, 6 Drawing Figs.

[52] U.S. Cl. .......... 317/234 R, 317/235 R, 317/234 A, 317/234 E, 317/234 N, 174/52.6
[51] Int. Cl. .......... H01l 3/00
[50] Field of Search .......... 317/234, 235, 1, 3, 3.1, 5, 5.4; 174/52.6, 52.16; 29/587, 588, 589

[56] References Cited

UNITED STATES PATENTS

| | | | |
|---|---|---|---|
| 3,423,516 | 1/1969 | Segerson | 317/234 |
| 3,348,101 | 10/1967 | Klein et al. | 317/234 |
| 3,528,102 | 9/1970 | Rodet et al. | 317/234 |

*Primary Examiner*—John W. Huckert
*Assistant Examiner*—Andrew J. James
*Attorney*—Frank R. Trifari

ABSTRACT: A semiconductor device comprising a metal cooling plate on which a semiconductor body is arranged, a number of conductors electrically connected to the semiconductor body and protruding from a synthetic resin envelope. The cooling plate is located on an outer side of the envelope, and opening being provided in the cooling plate and in the envelope for passing a fastening bolt, while the part of the opening located above the cooling plate is formed by a pressure-resistant metal ring.

INVENTOR.
PETER W. M. VAN DE WATER
By
Frank R. [signature]
AGENT

INVENTOR.
PETER W. M. VAN DE WATER

By Frank R. Trifari
AGENT

SEMICONDUCTOR DEVICE HAVING AN IMPROVED HEAT SINK ARRANGEMENT

The invention relates to a semiconductor device comprising a semiconductor body, a metal, flat cooling plate holding the semiconductor body, a number of metal conductors electrically connected to the semiconductor body and a substantially prismatic envelope of synthetic resin, from which the conductors protrude, the face of the cooling plate opposite the face holding the semiconductor body being coplanar to the flat side of the envelope, an opening being provided in the cooling plate and in the envelope extending transversely of the length of a cooling plate.

Such a semiconductor device, particularly a high-power transistor, is urged by the cooling plate portion located on the outer side of the envelope against a heat-removing body, for example, by means of a bolt extending through the opening and screwed into the heat-removing body. With the known semiconductor devices of this kind, a firm fastening of the semiconductor device to the heat-removing body may give rise to difficulties, because, at the area of the bolt head the synthetic resin is heavily loaded and may break down. Moreover, the manufacture of the known semiconductor device requires complicated solutions. The moulding jig of the synthetic resin envelope of the semiconductor device has to be provided with a pin covering the area for providing the opening in the envelope during the casting process. Means have to be provided for urging the cooling plate against the lower side of the jig during casting of the synthetic resin on order to prevent synthetic resin from getting there.

The invention has for its object to provide a semiconductor device of the kind set forth, which permits a firm fastening to a heat-removing body without the synthetic resin envelope being damaged, while the manufacture is simpler than that of the known semiconductor devices. For this purpose, in accordance with the invention, the inner edge of the opening in the synthetic resin envelope is formed by an annular member which extends up to the outer face of the envelope opposite the cooling plate and which is integral with the cooling plate.

The head of the fastening bolt bears on the upper end of the pressure-resistant, annular body and therefore can not exert destructive forces on the synthetic resin. The fastening force of the bolt may then be very high so that a very intimate thermal contact between the cooling plate and the heat-removing body is established. The jig need not satisfy particular requirements, the upper side of the jig bears on the ring so that on the one hand the cooling plate is firmly urged against the lower side of the jig and on the other hand synthetic resin is prevented from flowing beneath the cooling plate or into the opening of the ring.

In an advantageous embodiment of the invention, the annular body and the cooling plate are formed by separate parts, the annular body engaging the cooling plate by a head face and being fastened thereto by solder. This embodiment is simple in construction.

In a further embodiment of the invention, the cooling plate has a chamber around its opening, the bottom wall of which is inclined, one end of the annular body fitting in the chamber and the head face located at said end bearing on the highest area of the bottom wall of the chamber. When the jig is filled, the upper side exerts pressure on the ring. The highest area of the bottom wall of the chamber is plastically depressed to an extent such that the upper side of the ring is just located at the desired height. Thus, some deviations in dimensions of the ring or of the cooling plate are automatically compensated for. This advantage may also be obtained in a further embodiment of the invention by providing the annular body with a projecting ridge at least on the head face engaging the cooling plate.

In a further embodiment of the invention, the annular body is integral with the cooling plate and is obtained from the material of the cooling plate by plastic deformation.

The invention will be described more fully with reference to the embodiments shown in the drawing.

Figure 1:
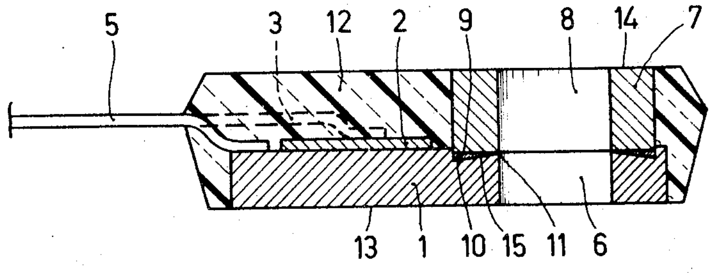
FIG. 1 is a cross-sectional view of a first embodiment of the semiconductor device.
Figure 2:
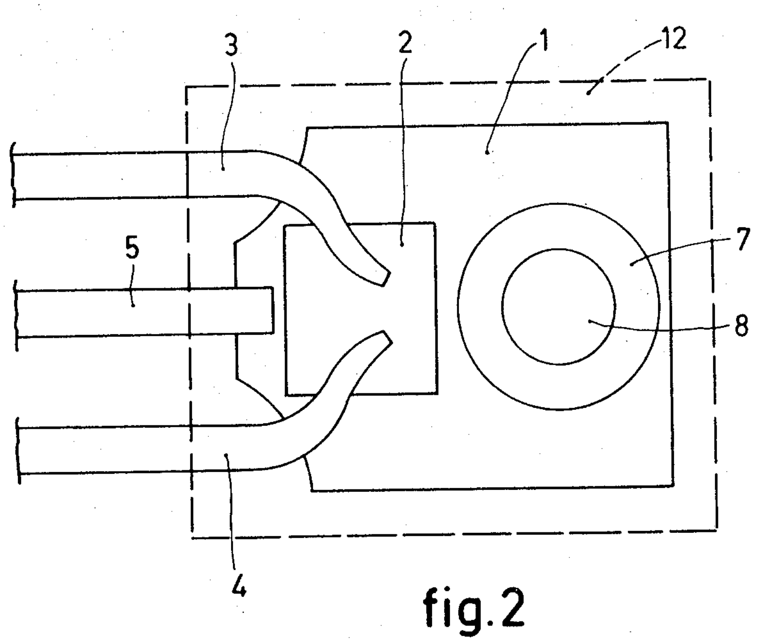
FIG. 2 is a plan view of the semiconductor device of FIG. 1, the synthetic resin envelope not yet being provided.

The semiconductor device shown in FIGS. 1 and 2 comprises a cooling plate 1, for example of copper, to which a semiconductor element 2 is secured, for example, by solder. Two current conductors 3 and 4 are soldered to the contact areas of the semiconductor element and a third conductor 5 is soldered to the cooling plate 1. The cooling plate has an opening 6. An annular body 7, whose inner opening 8 preferably has the same shape as the opening 6 in the cooling plate 1, bears by a head face 9 on the cooling plate. The cooling plate has a chamber 10, which may be obtained by depressing the material of the cooling plate. The chamber 10 has an inclined bottom wall 15. The ring 7 is centered by the chamber 10 and bears on the highest area 11 of the bottom wall 15. By urging the ring 7 against the area 11, which area may be slightly depressed, the desired overall height of the cooling plate and the ring 7 can be obtained even in the event of deviations from the dimensions. The ring 7 is fastened to the cooling plate by solder. The resultant assembly is accommodated in a synthetic resin envelope 12, which leaves the bottom side 13 of the cooling plate and the head face 14 of the ring exposed.

Such a semiconductor device is placed by the free side 13 of the cooling plate on a flat heat-removing body. The bolt (not shown) passing through the opening 6, 8 can be firmly tightened so that an intimate contact is established between the cooling face 13 and the heat-removing body. The bolt head bears on the upper side 14 of the high-pressure-resistant ring 7 so that the envelope 12 will not be damaged. Since the cooling plate may have a comparatively great thickness, for example, 2 mm. and since the opening 6 of the cooling plate engaging the heat-removing body is located near the semiconductor body 2 a very effective drain of heat is obtained. The envelope is thus also suitable for high-power transistors, for example, of 100 w.

Figure 3:
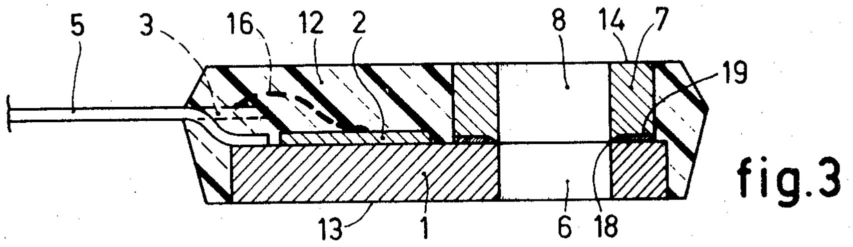
FIGS. 3 and 4 are a sectional view and an elevation respectively of a second embodiment.
Figure 4:
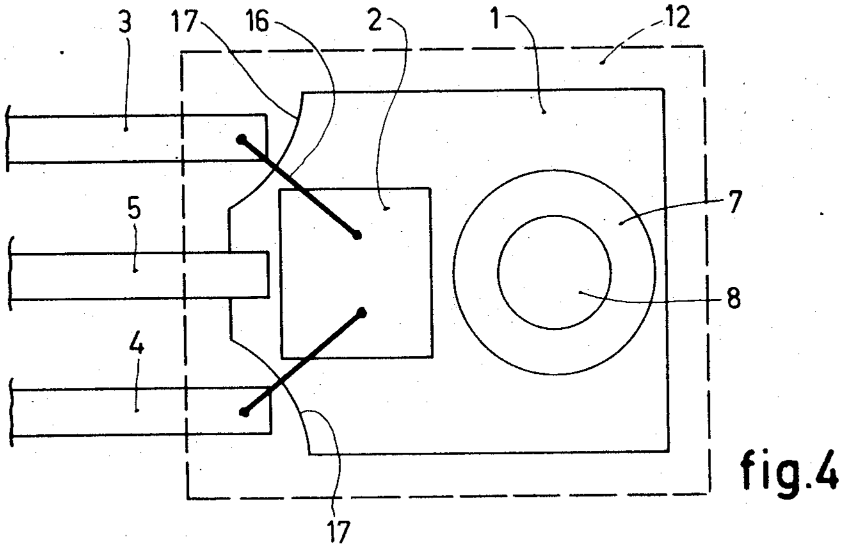

FIGS. 3 and 4 show a further embodiment of the semiconductor device; the identical parts are designated by the same reference numerals as in FIGS. 1 and 2. In the embodiment shown in FIGS. 3 and 4 the conductors 3 and 4 need not extend as far as above contact areas of the semiconductor element 2; from the conductors 3 and 4 a conductor wire 16, for example, of gold may be used for this connection. The connection of the wire 16 to the conductors 3 and 4 and to the semiconductor element 2 may be established in known manner. The cooling plate 1 has two recesses 17 which permit, when establishing the connection of the wire 16, of providing a support under said conductors 3 and 4 so that even a connection can be established by means of an ultrasonic welding apparatus.

In this embodiment, the annular body 7 has a ridge 18 on the head face 19 engaging the cooling plate 1. By exerting pressure on the ring 7 the ridge 18 may be deformed so that the upper side of the ring 7 is just located at the desired height. Inaccuracies of the dimensions of thickness of the cooling plate 1 and the ring 7 are thus automatically obviated.

Figure 5:
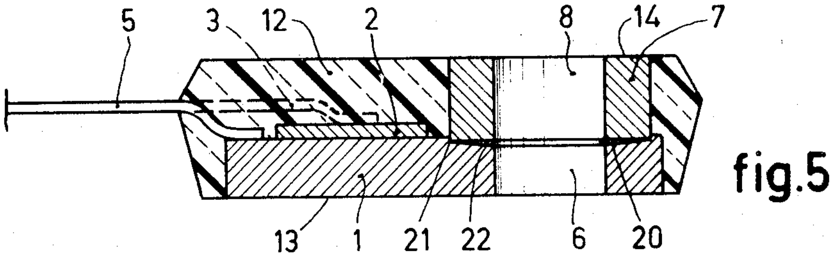
FIG. 5 is a sectional view of a further embodiment of the semiconductor device and FIG. 6 shows a unit consisting of the cooling plate and the ring.

FIG. 5 shows a similar embodiment as FIG. 1. The chamber 20 in the cooling plate 1 now has a bottom wall 22 inclined in a direction opposite that of the wall 15 in FIG. 1. The ring bears on the highest area 21 of this inclined bottom face 22. Also, in this case, the ring 7 is pressed at the highest area 21 into the face 22 until the assembly of cooling plate and ring is at the correct height.

Figure 6:
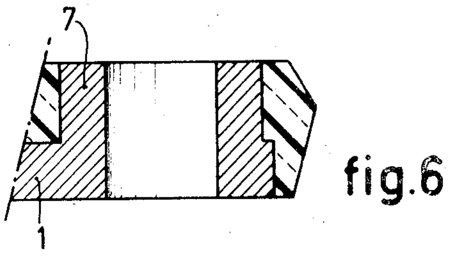

FIG. 6 shows a cooling plate 1 in which the ring 7 is obtained by plastic machining so that the ring and the cooling plate are integral with each other.

It will be obvious that the way of connection of the conductors 13 to the semiconductor element 2 is not essential to the invention. The conductors 3, 4 and 5 could be made together with the cooling plate from a thin strip of metal; the thermal capacity of the fairly thin cooling plate is, however, markedly lower than that of the embodiments shown. For high-power transistors a separate, thick cooling plate is preferred. It will furthermore be obvious that the ridge 18 of the ring 7 may be provided at a different place of the head face 19 and that the head face 14 may also be provided with a ridge. Moreover, the cooling plate 15 may be provided with a circular ridge, if desired in a chamber which need not have an inclined bottom wall.

The manufacture of the semiconductor device will now be described with reference to the embodiments of FIGS. 1 and 2. The cooling plate 1 is arranged in a soldering jig and the semiconductor element is disposed on the cooling plate with the interposition of a disc of solder. A disc of solder is arranged in the chamber 10, after which the ring 7 is put in place. The ring is then pressed against the area 11 of the cooling plate until the overall height of the cooling plate 1 and the ring 7 just has the desired value. Deviations from the correct dimensions of the ring and/or the cooling plate are thus automatically obviated. The conductors 3, 4 and 5, which preferably form in this stage part of a conductor comb are arranged in the soldering jig, the ends being urged against contact areas of the semiconductor element 2 and against the cooling plate 1 respectively with the interposition of solder. The soldering jig is then introduced into a furnace, so that all soldering joints are obtained simultaneously. The resultant assembly is finally arranged in a mould in which the synthetic resin envelope is made. After the conductors 3, 4 and 5 are cut to length the semiconductor device is ready for use.

What is claimed is:

1. A semiconductor device comprising a flat metallic cooling plate having first and second main surfaces, a semiconductor element attached to the plate on the first main surface, a synthetic resin envelope enclosing and in contact with the semiconductor element and plate but not on the second main surface of the plate, a plurality of metal conductors electrically connected to the semiconductor element and protruding from the synthetic resin envelope, an aperture in the cooling plate transverse to said main surfaces, and a pressure resistant apertured member embedded in the envelope and defining an aperture in the envelope coextensive with the aperture of said cooling plate, said member extending from the first main surface of the plate to the surface of the synthetic resin envelope.

2. A semiconductor device as claimed in claim 1, wherein the pressure resistant apertured member is an annular member.

3. A semiconductor device as claimed in claim 2, wherein the annular member and the cooling plate form separate metal parts, the annular member engaging the cooling plate by a head face and being fastened thereto by solder.

4. A semiconductor device as claimed in claim 3, wherein the cooling plate is provided around its aperture with a chamber having a bottom wall which is inclined, one end of the annular member fitting in said chamber and the head face located at said end bearing on the highest area of the bottom wall of the chamber.

5. A semiconductor device as claimed in claim 3, wherein the annular member is provided with a projecting ridge at least on its head face engaging the cooling plate.

6. A semiconductor device as claimed in claim 2, wherein the annular member is integral with the cooling plate and is obtained from the material of the cooling plate by plastic deformation.

* * * * *